(12) United States Patent
Imura et al.

(10) Patent No.: US 9,818,691 B2
(45) Date of Patent: Nov. 14, 2017

(54) SEMICONDUCTOR DEVICE HAVING A FUSE ELEMENT

(71) Applicant: SII Semiconductor Corporation, Chiba-shi, Chiba (JP)

(72) Inventors: Yukihiro Imura, Chiba (JP); Yoshitaka Kimura, Chiba (JP); Masaru Akino, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 15/065,977

(22) Filed: Mar. 10, 2016

(65) Prior Publication Data

US 2016/0268197 A1    Sep. 15, 2016

(30) Foreign Application Priority Data

Mar. 12, 2015  (JP) ................... 2015-049782
Jan. 18, 2016  (JP) ................... 2016-007338

(51) Int. Cl.

| H01L 21/3205 | (2006.01) |
|---|---|
| H01L 21/82 | (2006.01) |
| H01L 23/52 | (2006.01) |
| H01L 27/04 | (2006.01) |
| H01L 21/822 | (2006.01) |
| H01L 23/525 | (2006.01) |
| H01L 23/00 | (2006.01) |

(52) U.S. Cl.
CPC ........ *H01L 23/5258* (2013.01); *H01L 23/564* (2013.01)

(58) Field of Classification Search
CPC ......... G11C 17/18; G11C 17/16; G11C 17/14; G11C 29/02; G11C 29/44; H01L 2924/00; H01L 21/3205; H01L 21/82; H01L 21/822; H01L 23/52; H01L 27/04
See application file for complete search history.

(56) References Cited

U.S. PATENT DOCUMENTS

| 5,872,390 | A  | * | 2/1999  | Lee     | H01L 23/5256 257/529 |
|---|---|---|---|---|---|
| 6,303,970 | B1 | * | 10/2001 | Lee     | H01L 23/5258 257/173 |
| 6,822,309 | B2 | * | 11/2004 | Hirota  | H01L 23/5258 257/529 |

(Continued)

OTHER PUBLICATIONS

Abstract, Publication No. JP 2011-049252, Publication date Mar. 10, 2011.

*Primary Examiner* — Allen Parker
*Assistant Examiner* — Ismail Muse
(74) *Attorney, Agent, or Firm* — Adams & Wilks

(57) ABSTRACT

A corrosion resistant semiconductor device includes fuse elements that can be cut by laser light. An upper portion of the fuse elements is covered with a porous insulating film so that, when laser light irradiated from a rear surface of a semiconductor substrate is collected at selected fuse elements, the fuse elements generate heat, expand, and rupture. A metal lattice having a plurality of windows is disposed over the fuse elements to permit rapid expansion of the fuse elements when irradiated with the laser light. Alternatively, a metal array having a plurality of independent light-shielding portions may be disposed over the fuse elements to prevent the laser light from adversely affecting circuitry on the front surface side of the semiconductor device.

19 Claims, 4 Drawing Sheets

(56) References Cited

U.S. PATENT DOCUMENTS

| | | | | |
|---|---|---|---|---|
| 7,041,514 B1* | 5/2006 | Vrijen | ............... | H01L 22/22 257/48 |
| 7,180,154 B2* | 2/2007 | Cho | ............... | H01L 23/5258 257/103 |
| 2002/0135043 A1* | 9/2002 | McDevitt | ............ | H01L 23/5258 257/529 |
| 2003/0139028 A1* | 7/2003 | Sun | ............... | H01L 23/5258 438/601 |
| 2003/0173597 A1* | 9/2003 | Kamiya | ............. | H01L 23/5258 257/209 |
| 2005/0077594 A1* | 4/2005 | Matsunaga | ......... | H01L 23/5256 257/529 |
| 2006/0076642 A1* | 4/2006 | Ido | ............... | H01L 23/5258 257/529 |
| 2006/0278953 A1* | 12/2006 | Shimizu | ............. | H01L 23/5258 257/529 |
| 2008/0093704 A1* | 4/2008 | Park | ............... | H01L 23/564 257/529 |
| 2011/0001210 A1* | 1/2011 | Jeon | ............... | H01L 23/5258 257/529 |
| 2011/0073986 A1* | 3/2011 | Minami | ............. | H01L 23/5258 257/529 |
| 2011/0079873 A1* | 4/2011 | Oshima | ............. | H01L 23/5256 257/529 |
| 2014/0349474 A1* | 11/2014 | Kim | ............... | H01L 23/525 438/601 |
| 2016/0093557 A1* | 3/2016 | Nishikizawa | ....... | H01L 25/0655 257/676 |
| 2016/0268196 A1* | 9/2016 | Imura | ................ | H01L 23/564 |

* cited by examiner

SEMICONDUCTOR DEVICE HAVING A FUSE ELEMENT

BACKGROUND OF THE INVENTION

1. Field of the Invention

The present invention relates to a semiconductor device, and more particularly, to a semiconductor device including a fuse element that can be cut for changing a circuit configuration of the semiconductor device, and to a method of manufacturing the semiconductor device.

2. Description of the Related Art

In manufacturing a semiconductor device, after a wafer manufacturing process called a front-end process is finished, there is a process of changing a circuit configuration of a semiconductor device by cutting a fuse element formed of, for example, polysilicon or metal by using, for example, a laser, which occupies part of a back-end process. In this process, a resistance value can be corrected to obtain desired characteristics after electrical characteristics of the semiconductor device are measured. This process is thus an effective manufacturing process particularly for semiconductor devices that place emphasis on their analog characteristics.

In this process, it is required for the fuse element to be stably cut by the laser and have a high corrosion resistance. Hitherto, an insulating protective film is formed on an upper portion of a semiconductor device, and, for example, a silicon nitride film is used for the purpose of preventing moisture from coming in from the outside and other purposes. However, a fuse element is assumed to be cut later by laser radiation, and thus, a sufficiently thick silicon nitride film cannot be formed thereon. This is because a silicon nitride film is mechanically robust and is not easily broken by laser radiation simultaneously with the fuse element. Accordingly a protective film above the fuse element is, in general, removed, and thus, the protective film is absent above the fuse element. Further, an insulating film under the protective film is removed as well so as to have a desired thickness suitable for cutting the fuse element, and thus, only an insulating film that is mainly an oxide film for separating wiring layer slightly remains on the fuse element. The fuse element is liable to be affected by incoming moisture, and it is necessary to improve corrosion resistance thereof.

In Japanese Patent Application Laid-open No. 2011-49252, there is proposed a method of improving a corrosion resistance by forming a moisture-resistant insulating film such as a silicon nitride film or a silicon oxynitride film on at least a side surface of a fuse element, or on the side surface and an upper portion of the fuse element in such a manner that the moisture-resistant insulating film is thinner on the upper portion than on the side surface.

However, the above-mentioned related art has the following problems. Although moisture basically enters from a portion above the fuse element from which the protective film is removed, in the method, no moisture-resistant insulating film is formed or the thin moisture-resistant insulating film is formed on the upper portion of the fuse element. As a result the protection of the upper portion is insufficient. Further the use of the silicon nitride film or the silicon oxynitride film as the moisture-resistant insulating film results in strict conditions for cutting the fuse element because the radiated laser beam is absorbed by the film. In this method, the moisture-resistance improvement and the stability of cutting the fuse element by the laser have a trade-off relationship, and hence obtaining conditions that satisfy both the requirements are difficult to achieve. This is because the related-art configuration focuses only on an uncut fuse element and has no effect on a fuse element cut by the laser. When the fuse element is cut, the fuse element is exposed from the cut surface to cause corrosion. The fuse element is corroded from the cut surface and the fuse element thus expands, resulting in cracking of the insulating film formed on the fuse element. Further, a problem arises in that the crack becomes an entering route of the moisture, and hence the corrosion progresses inside the semiconductor device.

SUMMARY OF THE INVENTION

The present invention has been made in view of the problems described above, and provides a semiconductor device including a fuse element, which may be uniformly cut through provision of an insulating film, which is formed thereon and has a thickness suitable for the cutting, in which progress of corrosion from the cut portion of the fuse element may be inhibited through provision of a silicon nitride film, which is formed at an uppermost portion thereof and has a uniform thickness.

In order to solve the problems, according to one embodiment of the present invention, a front surface of a semiconductor device is covered with a silicon nitride film having a uniform thickness. A net that is a metal lattice is formed between the silicon nitride film and a fuse element to facilitate breakage of the fuse element. Laser light is radiated from a rear surface of the semiconductor device and the laser light is collected at the fuse element formed on an oxide film on a front surface of a semiconductor substrate, thereby being capable of cutting the fuse element.

According to the one embodiment of the present invention, the fuse element is not exposed at a cut surface thereof after the fuse element is cut by the laser light, and thus, the possibility that the fuse element is corroded is extremely low. A semiconductor device including a fuse element can be provided that inhibits appearance of a new path of incoming moisture and prevents progress of corrosion due to moisture coming in the semiconductor device.

BRIEF DESCRIPTION OF THE DRAWINGS

FIGS. 1A and 1B are an illustration of a semiconductor device according to a first embodiment of the present invention, in which FIG. 1A is a plan view and FIG. 1B is a sectional view taken along the line A-A of FIG. 1A.

DETAILED DESCRIPTION OF THE INVENTION

Now, various embodiments of the present invention are described with reference to the drawings.

[First Embodiment]

Figure 1A:
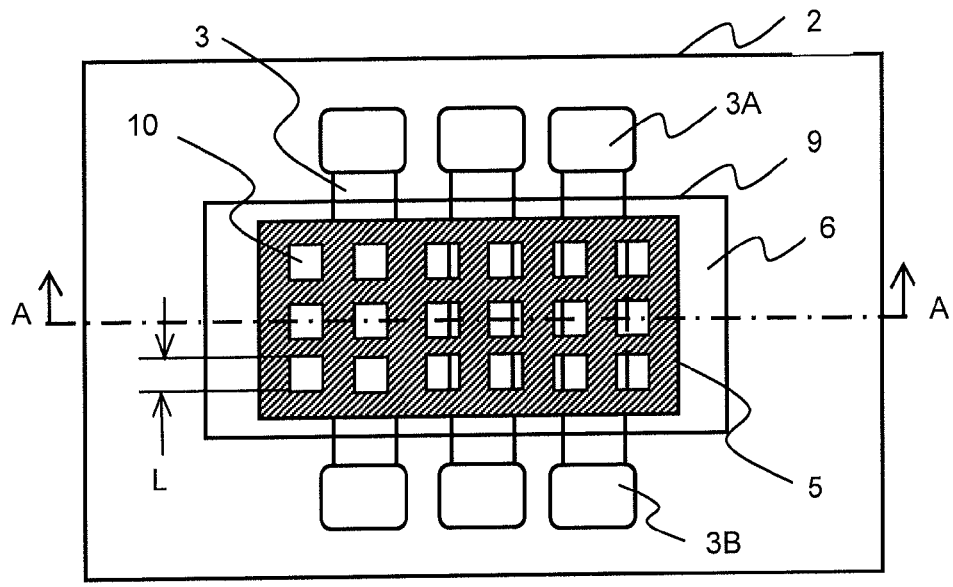
Figure 1B:
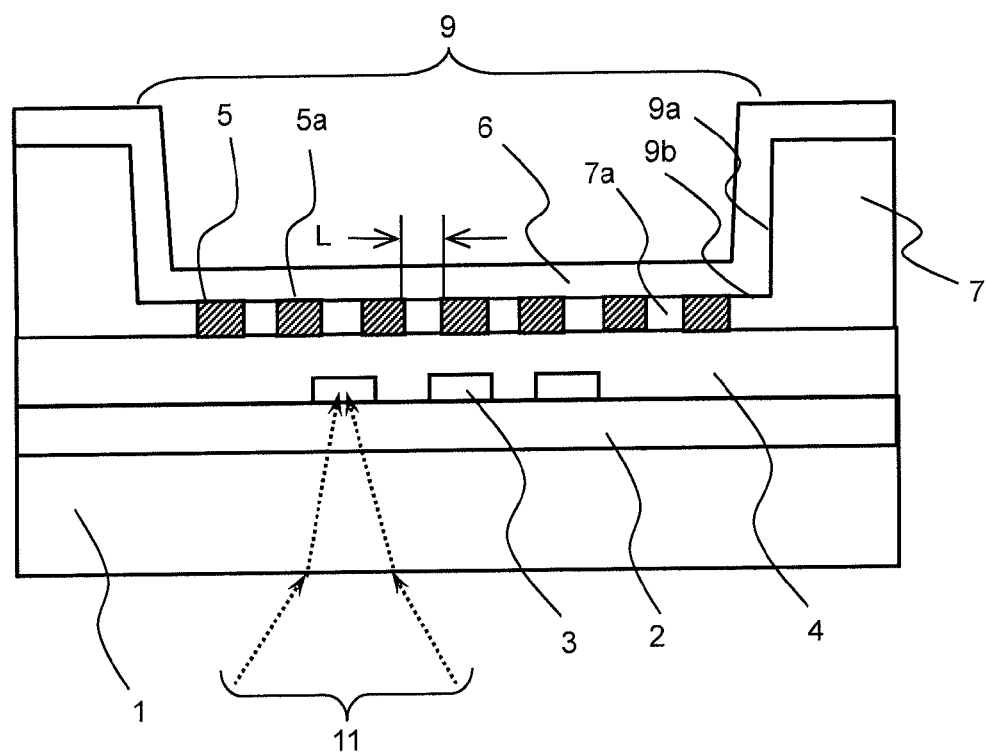

FIGS. 1A and 1B illustrate a semiconductor device according to a first embodiment of the present invention, in which FIG. 1A is a plan view and FIG. 1B is a sectional view taken along the line A-A of FIG. 1A.

As illustrated in FIG. 1A, a plurality of fuse elements 3 are arranged side by side on a field oxide film 2. One end of the fuse element 3 is a terminal 3a and another end of the fuse element is a terminal 3b. Each of the fuse elements 3 is connected to a circuit via the terminals. The circuit is configured to determine whether or not a current passes between the terminals 3a and 3b. A dimension of the fuse element 3 in a direction perpendicular to a direction of a current passing through the fuse element 3 is herein referred to as a width of the fuse element 3. In FIG. 1A, a direction perpendicular to a direction connecting the terminals 3a and 3b is the width of the fuse element 3. In this embodiment, a case in which the fuse element 3 is formed of polysilicon is described as an example. It goes without saying that the present invention can be similarly carried out when a metal is used as a material of the fuse element 3.

An opening region 9 is formed in a region including centers of the fuse elements 3 so that the film thickness is suitable for being cut by laser light. The opening region 9 is a recessed portion formed in an interlayer film, and is a region in which the interlayer film is removed to reduce the thickness thereof. Portions of the fuse elements 3 except for the terminals 3a and 3b at both the ends are arranged below a bottom portion of the opening region 9. A silicon nitride film 6 having a uniform thickness is formed in the opening region 9 on the entire surface of the interlayer film, for protecting a front surface of the semiconductor device. There is no region in which the silicon nitride film 6 is opened around the fuse elements 3. As described below, laser light for cutting the fuse element 3 is radiated from a rear surface of the semiconductor device, and thus, the silicon nitride film 6 can be formed on the entire surface of the opening region 9.

A lattice 5 formed of a metal is arranged under the silicon nitride film 6 that covers the opening region 9. The lattice 5 can be formed using, for example, a metal forming metal lines in a lowermost layer. As a matter of course, a metal forming metal lines in other layers may be used as well. In this embodiment, the lattice is a square lattice, and includes square windows 10 each having sides at a length of L. In this case, the length L of a side of the window 10 is shorter than a wavelength of laser light used for cutting the fuse element 3. This is for the purpose of confining the laser light radiated from a rear surface of the semiconductor substrate 1 toward the fuse element 3, thereby preventing the laser light from entering other regions. The lattice is formed so as not to cover the entire surface in order that a portion of the fuse element 3 cut by the laser light has room for rapid expansion. Further, the lattice 5 plastically deforms and thereby receives expansion and rupture of the cut portion as a net.

Further, as illustrated in FIG. 1B, the field oxide film 2 having the plurality of fuse elements 3 formed thereon is formed on a front surface of the semiconductor substrate 1. Side surfaces and a top surface of the fuse elements 3 are covered with an intermediate insulating film 4. As can be seen from FIG. 1B, the opening region 9 is a recessed portion formed in an interlayer film 7, and has side surfaces 9a formed by removing a part of the interlayer film 7 and a bottom portion 9b in which the interlayer film 7 is removed to reduce the thickness thereof. The opening region 9 is a region formed in the front surface of the semiconductor device in which the interlayer film 7 for insulating and separating metal lines such as a silicon oxide film is almost removed. The silicon nitride film 6 is formed on the entire surface of the opening region 9. The silicon nitride film 6 has a uniform thickness on both the thick interlayer film 7 and the side surfaces 9a and the bottom portion 9b of the opening region 9.

The lattice 5 not only confines the laser light but also serves as a monitor when the interlayer film 7 is partly removed by etching to leave a desired amount thereof. When the opening region 9 is formed by etching, through monitoring a metal forming the lattice 5, the lattice 5 and the interlayer film 7a filled therein can be left. This can control the interlayer film 7a formed above the fuse elements 3 to have a uniform thickness, which enables cutting conditions by the laser light to be constant. As a result, the windows 10 of the lattice 5 are almost filled with the interlayer film 7a. A top surface 5a of the lattice 5 is exposed to the bottom portion 9b of the opening region 9 because the interlayer film 7 formed on the top surface 5a is removed. Thus, the top surface 5a of the lattice 5 is in contact with the silicon nitride film 6.

Next, a method of cutting the fuse element 3 by the laser light is described.

In cutting the fuse element 3, laser light 11 for cutting the fuse element 3 is radiated from the rear surface of the semiconductor substrate 1 on which the semiconductor device is formed, the laser light 11 is controlled to be collected so that a focal point of the laser light 11 may be on the fuse element 3. A frequency of the laser light 11 is represented by ν. If energy hν of a photon is smaller than a band gap of the semiconductor substrate 1, the light is not absorbed, and thus, the laser light 11 can pass through the semiconductor substrate 1. However, if the laser light has a high intensity, the energy of a photon is an integral multiple of hν, which enables absorption thereof by the semiconductor substrate 1. This is action of light collection. The laser light 11 has a high intensity at the focal point, and in this case, is absorbed by the fuse element 3. The portion of the fuse element 3 to be cut that absorbs the laser light 11 generates heat, rapidly expands, and ruptures. In this way, the fuse element 3 is cut.

In this case, as described above, the lattice 5 deforms as a net, and absorbs change in volume of the fuse element 3 due to expansion and breakage thereof. When the semiconductor substrate 1 is formed of silicon, laser light having a wavelength of about 1,100 nm can pass through a silicon substrate having a thickness of about 500 μm. Note that, the field oxide film 2 exists between the semiconductor substrate 1 and the fuse element 3, but an oxide film is generally transparent to a light of infrared light or visible light and only slightly absorbs laser light in this range, and therefore, no problem arises.

Further, the lattice 5 is a square lattice having square windows 10, but the shape of the windows is not limited to a square, and may be a rectangle having a longer side and a shorter side both equal to or shorter than the wavelength of the laser light 11.

In the structure described above, laser light is radiated from the rear surface and the fuse element 3 is cut, and thus, the possibility that an exposed portion of the fuse element 3 is corroded after the fuse element 3 is cut by the laser light is extremely low. A semiconductor device having a fuse element can be provided that inhibits appearance of a new path of incoming moisture and prevents progress of corrosion due to moisture coming in the semiconductor device.

[Second Embodiment]

Next, a semiconductor device according to a second embodiment of the present invention is described with reference to the drawings.

Figure 2:
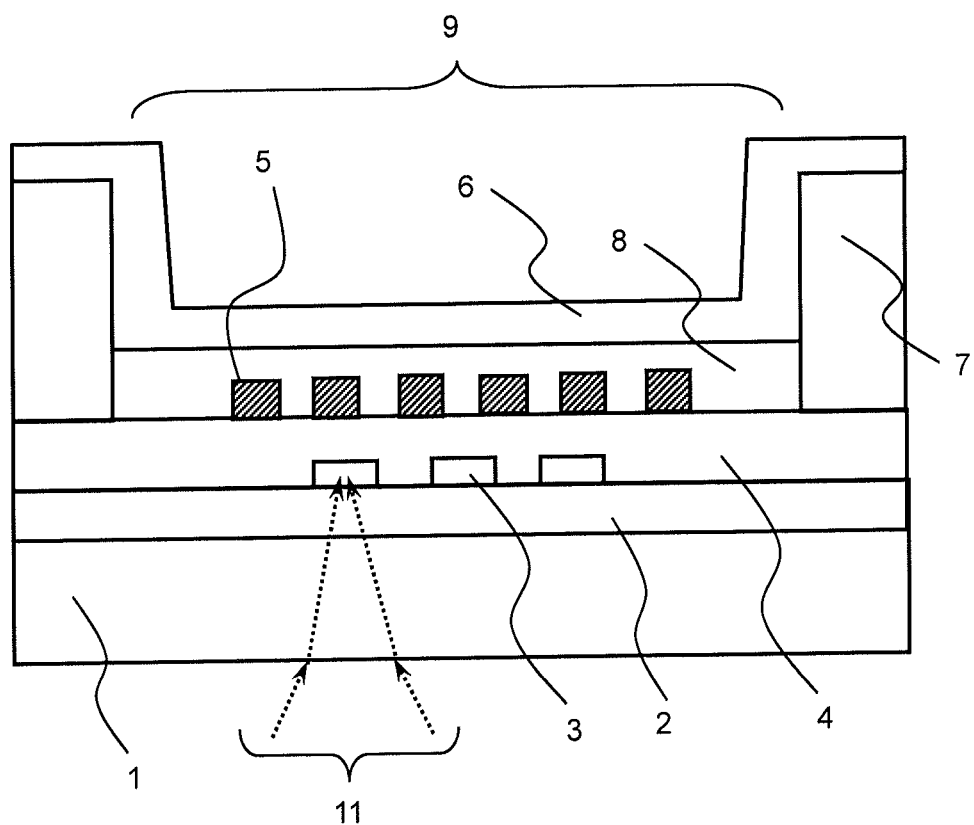
FIG. 2 is a sectional view for illustrating a semiconductor device according to a second embodiment of the present invention.

FIG. 2 is a sectional view of the semiconductor device according to the second embodiment of the present invention. Like reference numerals are used to designate like members illustrated in the sectional view of FIG. 1(b). A different point is that a porous insulating film 8 surrounds the lattice 5. In cutting the fuse element 3, a portion of the fuse element 3 cut by laser light 11 generates heat together with the intermediate insulating film 4 therearound, rapidly expands, and ruptures. Thus, the porous insulating film 8 surrounds the lattice 5 for the purpose of absorbing and confining the rupture in the lattice 5 and in the porous insulating film 8. This can prevent the cutting of the fuse element 3 from affecting the silicon nitride film 6.

The porous insulating film 8 may be deposited around the lattice 5 as follows: in forming the opening region 9 by etching in a region including the fuse elements 3, the metal forming the lattice 5 is monitored and appropriate overetching is carried out, thereby removing the interlayer film 7 around the lattice 5, and after that, the porous insulating film 8 is deposited. The porous insulating film 8, which is formed of, for example, a low-k material, has an affinity for the interlayer film 7 or other wiring metals, and may thus be deposited on the entire surface of the semiconductor device. In order to prevent moisture from coming in, the porous insulating film 8 is covered with the silicon nitride film 6.

[Third Embodiment]

Figure 3:
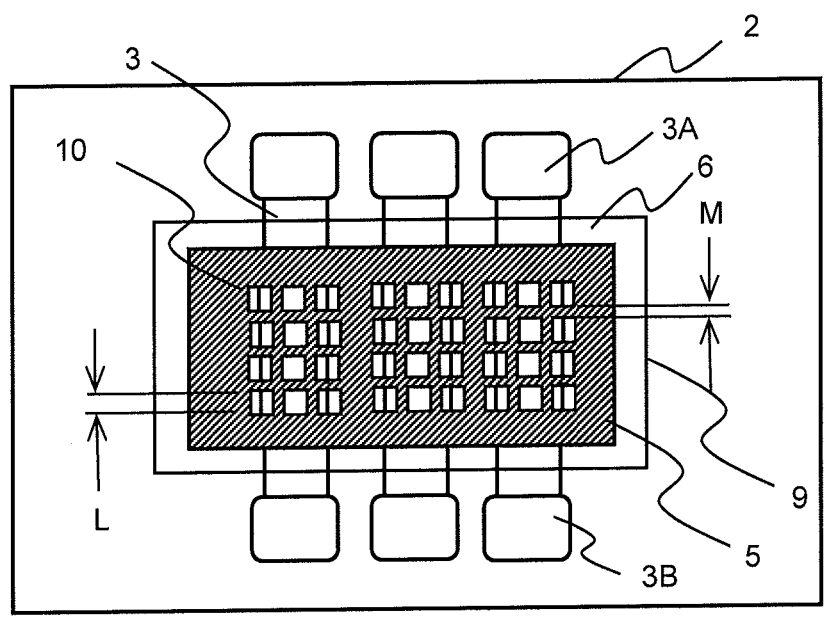
FIG. 3 is a plan view for illustrating a semiconductor device according to a third embodiment of the present invention.

FIG. 3 is a plan view for illustrating a semiconductor device according to a third embodiment of the present invention. In this embodiment, the lattice 5 is again used. This embodiment is different from the first embodiment in that the lattice 5 according to this embodiment has the windows 10 that are densely arranged above the fuse elements 3 compared with those in the first embodiment. This relatively reduces a window interval M that is a distance between adjacent windows 10. The windows 10 are rectangular, and have a longer side L that is shorter than the wavelength of the laser light used for cutting the fuse element 3. Determining the window interval M to be ½ to 1/10 of the longer side L of the windows 10 relatively reduces the window interval M, and, when the fuse element 3 is cut, the lattice 5 can be plastically deformed without restricting or inhibiting the expansion and the rupture of a portion of the fuse element 3 to which the laser light is radiated.

It is possible as well that the windows 10 are arranged in an entire surface of the lattice 5 with the window interval M being the same. This further facilitates the plastic deformation.

[Fourth Embodiment]

Figure 4:
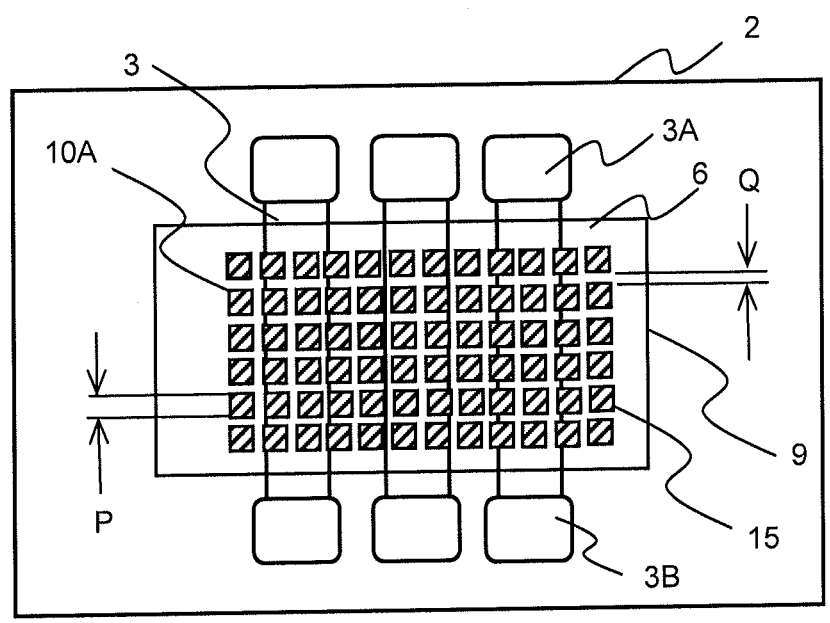
FIG. 4 is a plan view for illustrating a semiconductor device according to a fourth embodiment of the present invention.

FIG. 4 is a plan view for illustrating a semiconductor device according to a fourth embodiment of the present invention. According to this embodiment, an integral lattice is not formed, and instead, an array 15 is formed. The rest of the structure is similar to that in the first embodiment. The array 15 is formed of the same material as that of the lattice 5. In the array 15, a plurality of independent light-shielding portions 10A are two-dimensionally arranged. According to this embodiment, each of the light-shielding portions 10A is in the shape of a rectangle having a longer side P. The light-shielding portions 10A are arranged in vertical and horizontal directions with an interval Q that is a distance between adjacent light-shielding portions 10A. The interval Q is shorter than the wavelength of the laser light used for cutting the fuse element 3. Thus, the laser light radiated from the rear surface of the semiconductor substrate 1 cannot pass through the array 15, and thus, does not affect the metal lines and the like existing on the front surface side of the semiconductor device.

Further, the light-shielding portions 10A are independent from one another, and thus, can be plastically deformed with ease by the expansion and the rupture of a portion of the fuse element 3 to which the laser light is radiated when the fuse element 3 is cut.

Note that, according to this embodiment, the light-shielding portions 10A having the same shape are arranged. However, in order not to form slit-like space between the light-shielding portions 10A, each of the light-shielding portions 10A can be in the shape of a triangle or a hexagon, or light-shielding portions having different shapes can be used in combination so that the light-shielding portions can be two-dimensionally repeatedly arranged, which are more effective.

As described above, a semiconductor device can be provided in which the opening region 9 above the fuse elements 3 is entirely covered with the silicon nitride film 6.

What is claimed is:

1. A semiconductor device having a fuse element, comprising:
   a semiconductor substrate;
   a field insulating film formed on a front surface of the semiconductor substrate;
   a fuse element formed on the field insulating film;
   an intermediate insulating film completely covering a side surface and a top surface of the fuse element;
   a metal lattice formed on the intermediate insulating film and covering the fuse element, the metal lattice having a plurality of windows each of which has four sides;
   an interlayer film formed around the metal lattice;
   an opening region formed in the interlayer film and having a side surface and a bottom portion overlying a top surface of the metal lattice; and
   a silicon nitride film covering the side surface and the bottom portion of the opening region.

2. A semiconductor device according to claim 1, wherein the silicon nitride film is in contact with the top surface of the metal lattice.

3. A semiconductor device according to claim 1, further comprising a porous insulating film formed between the silicon nitride film and the intermediate insulating film so that the porous insulating film surrounds the metal lattice.

4. A semiconductor device according to claim 1, wherein the silicon nitride film has a uniform thickness on the interlayer film and on the side surface and the bottom portion of the opening region.

5. A semiconductor device according to claim 1, wherein each of the windows has a rectangular shape having opposed longer sides that are shorter than a wavelength of laser light to be irradiated on a rear surface of the semiconductor substrate to cut the fuse element.

6. A semiconductor device according to claim 5, wherein the rectangular windows are densely arranged above the fuse element.

7. A semiconductor device having a fuse element, comprising:
   a semiconductor substrate;
   a field insulating film formed on a front surface of the semiconductor substrate;
   a fuse element formed on the field insulating film;
   an intermediate insulating film covering a side surface and a top surface of the fuse element;
   a metal array formed on the intermediate insulating film and covering the fuse element, the metal array having a plurality of independent light-shielding portions each having a rectangular shape;
   an interlayer film formed around the metal array;

an opening region formed in the interlayer film and having a side surface and a bottom portion overlying a top surface of the metal array; and a silicon nitride film covering the side surface and the bottom portion of the opening region.

8. A semiconductor device according to claim 7, wherein the plurality of independent light-shielding portions are two-dimensionally arranged with an interval therebetween that is shorter than a wavelength of laser light to be irradiated on a rear surface of the semiconductor substrate to cut the fuse element.

9. A semiconductor device according to claim 8, wherein each of the plurality of light-shielding portions is in a shape that allows the plurality of light-shielding portions to be two-dimensionally repeatedly arranged.

10. A semiconductor device according to claim 8, wherein the plurality of light-shielding portions are in shapes that allow the plurality of light-shielding portions to be two-dimensionally repeatedly arranged by combining a predetermined number of the plurality of light-shielding portions.

11. A semiconductor integrated circuit device, comprising:

a semiconductor substrate having front and rear surfaces;

a field insulating film disposed on the front surface of the semiconductor substrate;

fuse elements disposed in spaced-apart relationship on the field insulating film, each fuse element having two opposite end portions interconnected by a middle portion;

an intermediate insulating film formed on the fuse elements and completely covering top and side surfaces of the fuse elements;

a metal lattice disposed over the intermediate insulating film and over the middle portions of the fuse elements, the metal lattice having a plurality of windows partly or completely overlying the middle portions of the fuse elements;

an interlayer film formed around the metal lattice and in the windows, the interlayer film having a recessed opening overlying the metal lattice; and a silicon nitride film formed on the interlayer film and on the entire surface of the recessed opening.

12. A semiconductor integrated circuit device according to claim 11; wherein some of the windows partly overlie the middle portions and others completely overlie the middle portions of the fuse elements.

13. A semiconductor integrated circuit device according to claim 12; wherein the windows have a rectangular shape.

14. A semiconductor integrated circuit device according to claim 13; wherein the windows have a square shape.

15. A semiconductror integrated circuit device according to claim 13; wherein the rectangularly-shaped windows have opposed longer sides and opposed shorter sides, the longer sides being shorter in length than a wavelength of laser light to be irradiated on the rear surface of the semiconductor surface to cut the middle portion of selected fuse elements.

16. A semiconductror integrated circuit device according to claim 13; wherein the interval between adjacent longer sides of each two adjacent windows overlying the middle portions of the fuse elemnets is ½ to ¹/₂₀ the length of the longer sides.

17. A semiconductror integrated circuit device according to claim 13; wherein the interval betwen adjacent longer sides of each two adjacent windows is ½ to ¹/₁₀ the length of the longer sides.

18. A semiconductror integrated circuit device according to claim 11; wherein the metal lattice is disposed over the middle portions of the fuse elements but not over the end portions of the fuse elements.

19. A semiconductror integrated circuit device according to claim 11; wherein the silicon nitride film has a uniform thickness on the interlayer film and on the recesed opening.

* * * * *